(12) United States Patent
Ok et al.

(10) Patent No.: US 9,508,816 B2
(45) Date of Patent: Nov. 29, 2016

(54) LOW RESISTANCE REPLACEMENT METAL GATE STRUCTURE

(71) Applicant: International Business Machines Corporation, Armonk, NY (US)

(72) Inventors: Injo Ok, Loudonville, NY (US); Balasubramanian Pranatharthiharan, Watervliet, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/042,800

(22) Filed: Feb. 12, 2016

(65) Prior Publication Data

US 2016/0163809 A1    Jun. 9, 2016

Related U.S. Application Data

(62) Division of application No. 14/558,249, filed on Dec. 2, 2014, now Pat. No. 9,305,923.

(51) Int. Cl.

| | |
|---|---|
| *H01L 29/423* | (2006.01) |
| *H01L 21/8238* | (2006.01) |
| *H01L 27/092* | (2006.01) |
| *H01L 29/49* | (2006.01) |
| *H01L 21/28* | (2006.01) |
| *H01L 21/3105* | (2006.01) |
| *H01L 29/66* | (2006.01) |
| *H01L 29/78* | (2006.01) |

(52) U.S. Cl.
CPC ... *H01L 29/42376* (2013.01); *H01L 21/28008* (2013.01); *H01L 21/31056* (2013.01); *H01L 21/82385* (2013.01); *H01L 27/0924* (2013.01); *H01L 29/42372* (2013.01); *H01L 29/49* (2013.01); *H01L 29/4966* (2013.01); *H01L 29/4975* (2013.01); *H01L 29/66545* (2013.01); *H01L 29/66795* (2013.01); *H01L 29/785* (2013.01)

(58) Field of Classification Search
CPC .......... H01L 27/0924; H01L 29/6681; H01L 29/49; H01L 29/42372; H01L 29/4966; H01L 21/82385; H01L 29/42376
USPC ....................................................... 257/369
See application file for complete search history.

(56) References Cited

U.S. PATENT DOCUMENTS

| | | |
|---|---|---|
| 2009/0087979 A1 | 4/2009 | Raghuram et al. |
| 2013/0078791 A1 | 3/2013 | Xie et al. |
| 2014/0008720 A1 | 1/2014 | Xie et al. |
| 2014/0070285 A1 | 3/2014 | Xie et al. |
| 2015/0206963 A1* | 7/2015 | Ho ............ H01L 21/31111 257/411 |

* cited by examiner

*Primary Examiner* — Walter H Swanson
(74) *Attorney, Agent, or Firm* — Scully, Scott, Murphy & Presser, P.C.; Steven J. Meyers

(57) ABSTRACT

A first sacrificial gate structure of a first width and a second sacrificial gate structure of a second width greater than the first width are provided on a semiconductor material portion. A dielectric spacer and a planarizing dielectric material are provided surrounding each sacrificial gate structure. Each sacrificial gate structure is then removed forming gate cavities. A high k dielectric material, a metal nitride hard mask and a physical vapor deposited (PVD) amorphous-silicon cap are provided. Vertical portions of the metal nitride hard mask and the high k dielectric material are removed from a portion of each gate cavity. Additional PVD amorphous silicon is then deposited and then all amorphous silicon and remaining metal nitride hard mask portions are removed. A work function portion having a stair-like surface, a diffusion barrier portion, a conductive metal structure and a dielectric cap are then formed into to each of the gate cavities.

9 Claims, 11 Drawing Sheets

LOW RESISTANCE REPLACEMENT METAL GATE STRUCTURE

BACKGROUND

The present application relates to a semiconductor structure and a method of forming the same. More particularly, the present application relates to a semiconductor structure containing replacement metal gate structures having low resistance and a method of forming the same.

Current complementary metal oxide semiconductor (CMOS) technology relies on a replacement metal gate process flow for fabricating n-type field effect transistors (nFETs) and p-type field effect transistors (pFETs). In such a process, a first workfunction metal layer is used in providing the replacement gate of the nFET, while a second workfunction metal layer, different from the first workfunction metal layer, is used in providing the replacement metal gate for the pFET.

The use of two different workfunction metal layers in providing the replacement metal gates for the nFET and pFET significantly impacts performance since integration of two workfunction metal layers leaves very little room for the gate conductors. Furthermore, aggressive scaling requires narrow gates which have very high gate resistance due to poor metal fill. Hence, there exists a need to solve the high gate resistance problem to ensure continuous scaling.

SUMMARY

A first sacrificial gate structure of a first width and a second sacrificial gate structure of a second width greater than the first width are provided on a semiconductor material portion. A dielectric spacer and a planarizing dielectric material are provided surrounding each sacrificial gate structure. Each sacrificial gate structure is then removed forming gate cavities. A high k dielectric material, a metal nitride hard mask and a physical vapor deposited (PVD) amorphous-silicon cap are provided. Vertical portions of the metal nitride hard mask and the high k dielectric material are removed from a portion of each gate cavity. Additional PVD amorphous silicon is then deposited and then all amorphous silicon and remaining metal nitride hard mask portions are removed. A work function portion having a stair-like surface profile, a diffusion barrier portion, a metal structure and a dielectric cap are then formed into to each of the gate cavities.

In one aspect of the present application, a method of forming a semiconductor structure containing replacement metal gate structures having low resistance is provided. In accordance with an embodiment of the present application, the method includes providing a structure comprising a first gate cavitiy of a first width and exposing a first portion of a semiconductor material portion and a second gate cavity of a second width that is greater than the first width and exposing a second portion of the semiconductor material portion, wherein a dielectric spacer surrounds the first and the second gate cavities. Next, a material stack comprising, from bottom to top, a high k dielectric material layer and a metal nitride hard mask layer is formed on exposed surfaces of the structure located inside and outside of the first and the second gate cavities. Thereafter, an amorphous-silicon cap is formed over the material stack, wherein the amorphous-silicon cap has a first portion located on horizontal surfaces of the material stack having a first thickness and a second portion located on vertical surfaces of the material stack having a second thickness that is less than the first thickness. Next, inner sidewall surfaces of the dielectric spacer surrounding the first and the gate cavities are exposed using the first portion of the amorphous-silicon cap as a mask. Additional amorphous-silicon is formed sealing the first gate cavity, but not the second gate cavity. Thereafter, the additional amorphous-silicon, remaining portions of the amorphous-silicon cap, and remaining portions of the metal nitride hard mask are removed to expose remaining portions of the high k dielectric material layer located within an upper and lower portion of the first and the second gate cavities. Next, a gate structure comprising from bottom to top, a workfunction metal portion having a stair-like surface profile, a diffusion barrier portion, a metal structure and a dielectric cap is formed on the remaining portion of the high k dielectric material located within the lower portion of the first and the second gate cavities, wherein during forming of the workfunction metal portion the remaining portion of the high k dielectric material is removed from the upper portion of the first and the second gate cavities.

In another aspect of the present application, a semiconductor structure containing replacement metal gate structures having low resistance is provided. In accordance with an embodiment of the present application, the semiconductor structure includes a first functional gate structure of a first width and located on a surface of a semiconductor material portion, wherein the first functional gate structure comprises, from bottom to top, a first high k gate dielectric material portion, a first workfunction metal portion having a stair-like surface profile, a first diffusion barrier portion, a first metal structure and a first dielectric cap. The structure of the present application also includes a second functional gate structure of a second width that is greater than the first width and located on another surface of the semiconductor material portion, wherein the second functional gate structure comprises, from bottom to top, a second high k gate dielectric material portion, a second workfunction metal portion having a stair-like surface profile, a second diffusion barrier portion, a second metal structure and a second dielectric cap. The structure of the present application further includes a dielectric spacer located on each sidewall surface of the first and the functional gate structures, and a planarizing dielectric material located adjacent the dielectric spacer, wherein a topmost surface of the planarizing dielectric material is coplanar with a topmost surface of the first and the second dielectric cap.

DESCRIPTION

Figure 1A:
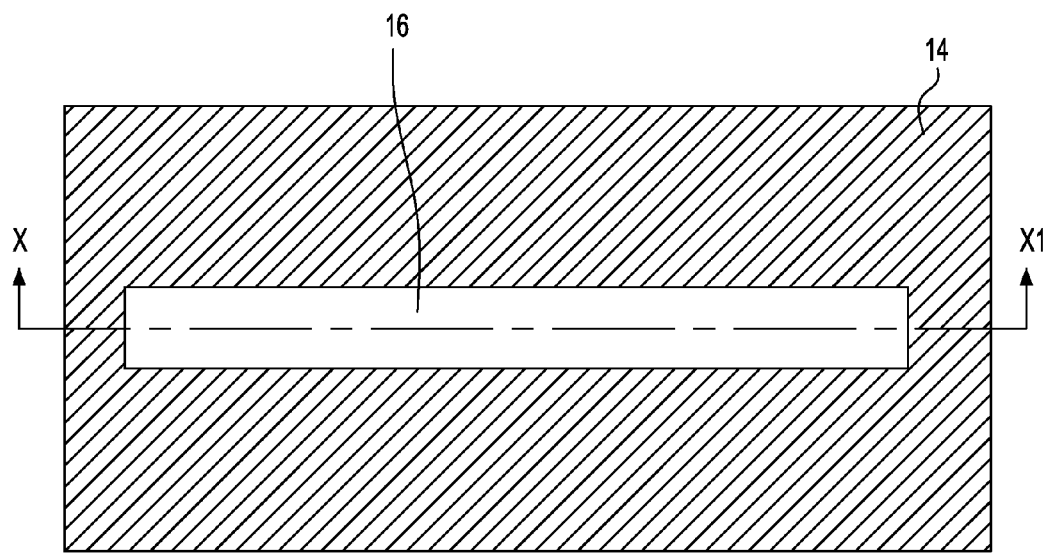
FIG. 1A is a top-down view of an exemplary semiconductor structure including a semiconductor material portion located on a substrate that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form replacement metal gate structures having low resistance for FinFET structures, the basic concept of the present application can also be used to form replacement metal gate structures having low resistance for planar field effect transistor devices as well.

Figure 1B:
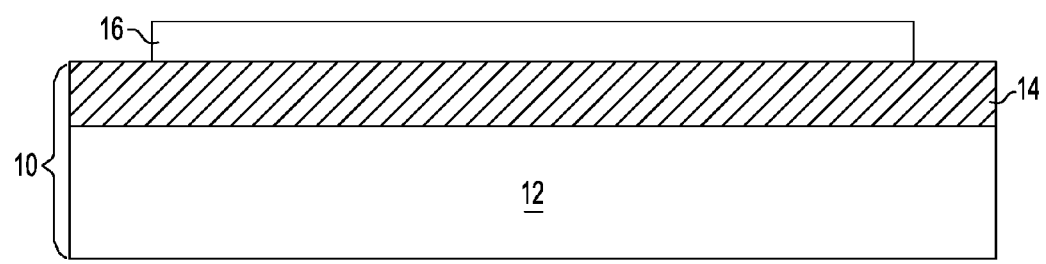
FIG. 1B is a cross sectional view of the exemplary semiconductor structure of FIG. 1A along vertical plane X-X1.

Referring first to FIGS. 1A-1B, there are illustrated an exemplary semiconductor structure including a semiconductor material portion 16 located on a substrate 10 that can be employed in one embodiment of the present application. In some embodiments, and as illustrated in the drawings of the present application, semiconductor material portion 16 may be a semiconductor fin. In such an embodiment, a plurality of semiconductor fins, i.e., semiconductor material portions, can be formed on the substrate 10. In such an embodiment, the semiconductor material portions are orientated parallel to each other. In other embodiments (not shown), the semiconductor material portion can represent a topmost surface of a planar semiconductor substrate.

In one embodiment of the present application, and as shown, the substrate 10 comprises, from bottom to top, a handle substrate 12 and an insulator layer 14. In another embodiment (not shown), the substrate 10 comprises a remaining portion of a bulk semiconductor substrate. The term "bulk" as used in conjunction with the phrase "semiconductor substrate" denotes that the entire substrate is comprised of at least one semiconductor material.

The exemplary semiconductor structure shown in FIGS. 1A-1B can be formed by first providing a bulk semiconductor substrate or a semiconductor-on-insulator (SOI) substrate. When a bulk semiconductor substrate is employed in the present application the at least one semiconductor material that provides the bulk semiconductor substrate can include, but is not limited to, Si, Ge, SiGe, SiC, SiGeC, III/V compound semiconductors such as, for example, InAs, InP, InAsP, and GaAs, and II/VI compound semiconductor materials. In such an embodiment, a topmost semiconductor material layer or portion of the bulk semiconductor substrate can be used as the semiconductor material portion 16, while the remaining portion of the bulk semiconductor substrate can be used as substrate 10. In some embodiments of the present application, the bulk semiconductor substrate may be a single crystalline semiconductor material. In other embodiments of the present application, the bulk semiconductor substrate may be a polycrystalline semiconductor material or an amorphous semiconductor material. The crystal orientation of the bulk semiconductor substrate may be {100}, {110}, or {111}. Other crystallographic orientations besides those specifically mentioned can also be used in the present application.

When an SOI substrate is employed, the SOI substrate includes from, bottom to top, the handle substrate 12, the insulator layer 14, and a topmost semiconductor layer. The topmost semiconductor layer of the SOI substrate will provide the semiconductor material portion 16 of the structure shown in FIGS. 1A-1B. In some embodiments of the present application, the handle substrate 12 and the topmost semiconductor layer of the SOI substrate may comprise a same semiconductor material. In other embodiments of the present application, the handle substrate 12 and the topmost semiconductor layer of the SOI substrate may comprise a different semiconductor material. The semiconductor material(s) that can be used as the handle substrate 12 and the topmost semiconductor layer include one of the semiconductor materials mentioned above for the bulk semiconductor substrate. In one embodiment, the handle substrate 12 and the topmost semiconductor layer of the SOI substrate are both comprised silicon. In some embodiments, the handle substrate 12 is a non-semiconductor material including, for example, a dielectric material and/or a conductive material.

The handle substrate 12 and the topmost semiconductor layer of the SOI substrate may have the same or different crystal orientation including any of those mentioned above for the bulk semiconductor substrate. The handle substrate 12 and/or the topmost semiconductor layer of the SOI substrate may be a single crystalline semiconductor material, a polycrystalline material, or an amorphous material. Typically, at least the topmost semiconductor layer of the SOI substrate is a single crystalline semiconductor material.

The insulator layer 14 of the SOI substrate may be a crystalline or non-crystalline oxide or nitride. In one embodiment, the insulator layer 14 is an oxide such as, for example, silicon dioxide. In another embodiment, the insulator layer 14 may include a stack of silicon dioxide and boron nitride.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of topmost semiconductor layer of the SOI substrate is typically from 10 nm to 100 nm, although other thicknesses that are lesser than or greater than the aforementioned thickness range may also be used for the thickness of the topmost semiconductor layer of the SOI substrate. The insulator layer 14 of the SOI substrate typically has a thickness from 1 nm to 200 nm, although other thicknesses that are lesser than or greater than the aforementioned thickness range from the insulator layer 14 of the SOI substrate can be used. The thickness of the handle substrate 12 of the SOI substrate is inconsequential to the present application.

In some embodiments of the present application, a hard mask layer (not shown) can be formed on a topmost surface of either the bulk semiconductor substrate or the SOI substrate. The hard mask layer that can be employed is a contiguous layer that covers the entirety of the topmost surface of the bulk semiconductor substrate or the SOI substrate. The hard mask layer that can be employed in the present application may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments of the present application, the hard mask material that can be used in providing the hard mask layer can be formed by a deposition process such as, for example, chemical vapor deposition (CVD) or plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process. The thickness of the hard mask material that can be used in providing the hard mask layer can range from 2 nm to 10 nm, although other thickness that are lesser than or greater than the aforementioned thickness range can be used for the hard mask layer.

Next, the bulk semiconductor substrate or the SOI substrate, with or without the hard mask layer, can be patterned to provide the semiconductor material portion 16 shown in FIGS. 1A-1B. In embodiments in which semiconductor material portion 16 is not a semiconductor fin, this patterning step can be used to form isolation trenches within the bulk semiconductor substrate or SOI substrate, which are thereafter processed into trench isolation structures.

In one embodiment, the patterning process used to define the semiconductor material portion 16 may include a sidewall image transfer (SIT) process. The SIT process includes forming a contiguous mandrel material layer (not shown) on the topmost surface of the hard mask layer, the bulk semiconductor substrate or the SOI substrate. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown).

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching. Since the dielectric spacers are used in the SIT process as an etch mask, the width of the each dielectric spacer can be used to determine the width of each semiconductor material portion 16.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the semiconductor material that provides the semiconductor material portion 16. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process. In some embodiments, lithography and etching can be used to define the semiconductor material portion 16. In some embodiments and following formation of the semiconductor material portion 16, the hard mask material can be removed from atop the semiconductor material portion 16 by a planarization process or by etching.

As mentioned above, semiconductor material portion 16 can be a semiconductor fin. As used herein, a "semiconductor fin" refers to a contiguous semiconductor structure that extends upward from a surface of a substrate. In one embodiment, the substrate is insulator layer 14. In other embodiments, the substrate is a remaining portion of a bulk semiconductor substrate. Each fin structure that is formed includes a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor material portion 16 has a width from 4 nm to 30 nm. In another embodiment of the present application, each semiconductor material portion 16 has a width from 5 nm to 12 nm.

Although not shown, isolation regions including, for example, trench isolation structures and local isolation regions can be formed at this point of the present application utilizing processes that are well known to those skilled in the art.

Figure 2A:
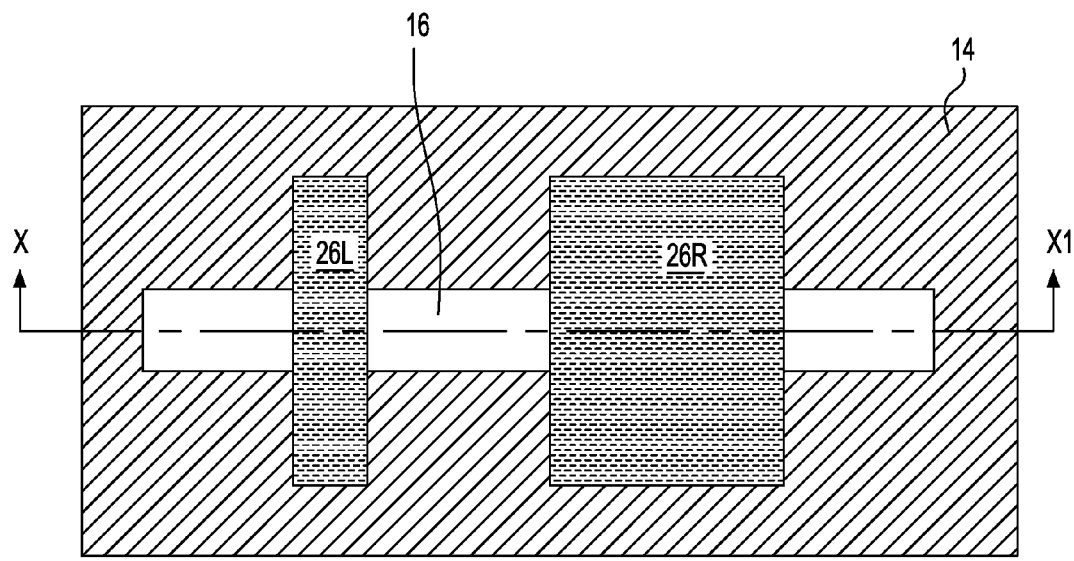
FIG. 2A is a top-down view of the exemplary semiconductor structure of FIGS. 1A-1B after forming a first sacrificial gate structure straddling a first portion of the semiconductor material portion, and a second sacrificial gate structure straddling a second portion of the semiconductor material portion.
Figure 2B:
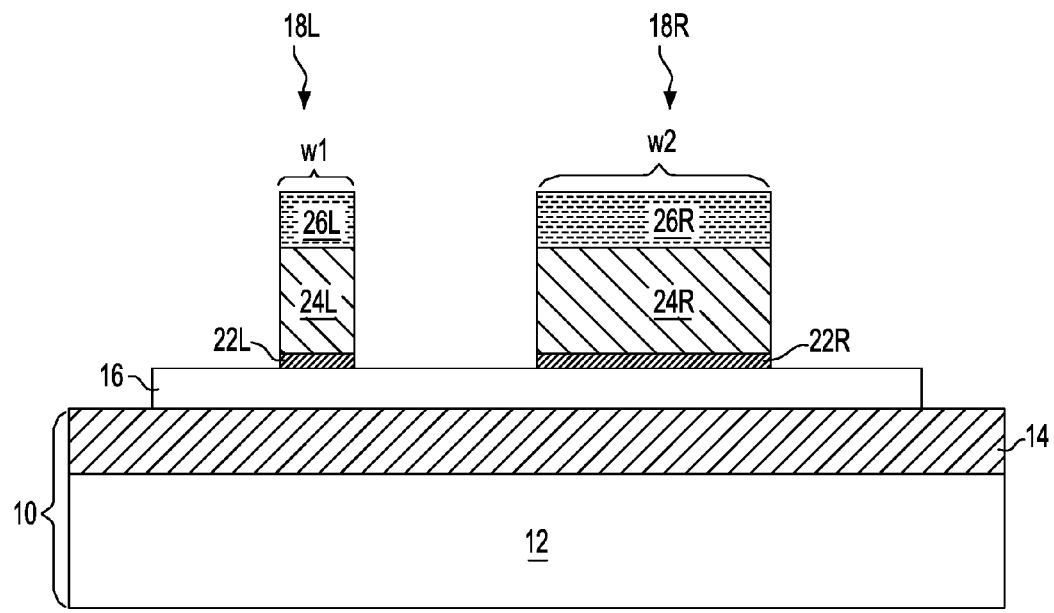
FIG. 2B is a cross sectional view of the exemplary semiconductor structure of FIG. 2A along vertical plane X-X1.

Referring now to FIGS. 2A-2B, there are illustrated the exemplary semiconductor structure of FIGS. 1A-1B after forming a first sacrificial gate structure 18L straddling a first portion of the semiconductor material portion 16, and a second sacrificial gate structure 18R straddling a second portion of the semiconductor material portion 16. By "straddling" it is meant that each sacrificial gate structure 18L, 18R is present on a topmost surface and sidewall surfaces of the semiconductor material portion 16. In embodiments in which the semiconductor material portion 16 is not a semiconductor fin, the sacrificial gate structures 18L, 18R would only be present on the topmost surface of the semiconductor material portion 16. The term "sacrificial gate structure" is used throughout the present application to denote a material stack that serves as a placeholder material for a functional gate structure to be subsequently formed.

In accordance with the present application, the first sacrificial gate structure 18L has a first width, w1, while the second sacrificial gate structure has a second width, w2, that is greater than the first width, w1. In one embodiment of the present application, the w2 is at least twice as large as w1.

It is noted that the first sacrificial gate structure 18L that has the first width, w1, can be used as a placeholder material for a short channel (p- or n-type) functional gate structure, while the second sacrificial gate structure 18R that has the second width, w2, can be used as a placeholder material for a long channel (p- or n-type) functional gate structure.

The first and second sacrificial gate structures 18L and 18R comprise, from bottom to top, a sacrificial gate dielectric portion 22L, 22R, a sacrificial gate portion 24L, 24R and a sacrificial dielectric cap portion 26L, 26R. The first sacrificial gate structure 18L and the second sacrificial gate stack 18R can be formed forming blanket layers of various materials over the exemplary semiconductor structure shown in FIGS. 1A-1B, and then patterning the various materials by lithography and an etch. Notably, the first sacrificial gate structure 18L and the second sacrificial gate structure 18R can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. Exemplary high kdielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation.

After forming the blanket layer of sacrificial gate dielectric material, a blanket layer of a sacrificial gate material is formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may include one of the materials mentioned above for the hard mask layer that was employed in forming the semiconductor material portions. The sacrificial gate cap material can be formed utilizing one of the techniques mentioned above for forming the hard mask layer.

After providing the above mentioned sacrificial material stack, a photoresist material can be formed atop the sacrificial gate cap material, and thereafter the photoresist material can be patterned by exposing the photoresist material to a pattern of irradiation and then developing the resist material. After providing the patterned photoresist atop the sacrificial gate cap material, an etch such as, for example, an anisotropic dry etch or wet etch process, can be employed to transfer the pattern into the blanket sacrificial material stack. The patterned resist material can be removed after the pattern transfer etch by utilizing a resist stripping process such as, for example, ashing. The remaining portions of the sacrificial gate dielectric material constitute a sacrificial gate dielectric portion 22L, 22R, the remaining portions of the sacrificial gate material constitute a sacrificial gate portion 24L, 24R, and the remaining portions of the sacrificial dielectric cap material constitute a sacrificial dielectric cap portion 26L, 26R.

In some embodiments of the present application, the patterning of the sacrificial material stack may include a sidewall image transfer process similar to the one mentioned above in forming the semiconductor material portion 16.

Figure 3A:
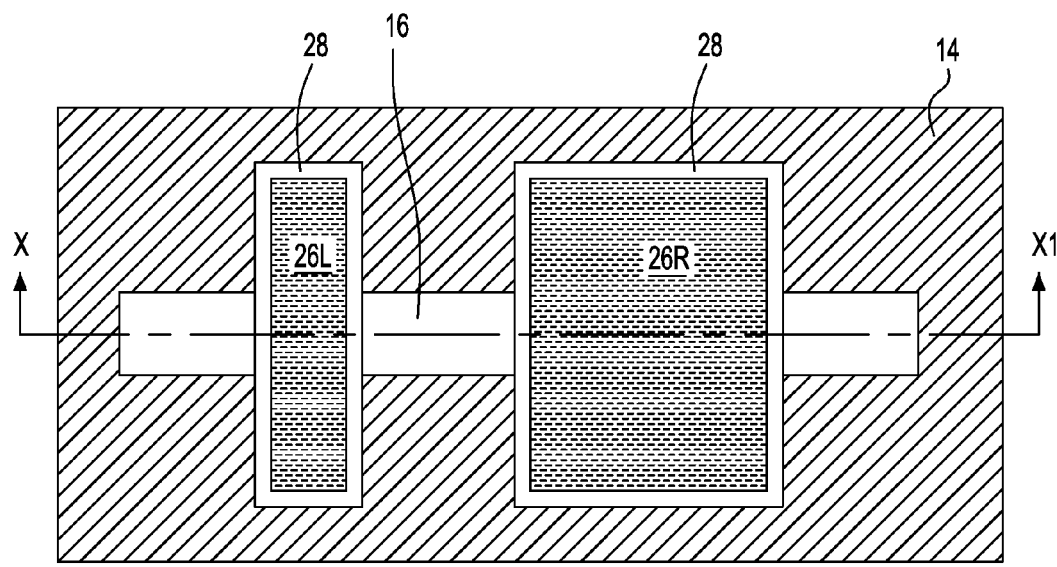
FIG. 3A is a top-down view of the exemplary semiconductor structure of FIGS. 2A-2B after forming a dielectric spacer on sidewall surfaces of the first sacrificial gate structure and the second sacrificial gate structure.
Figure 3B:
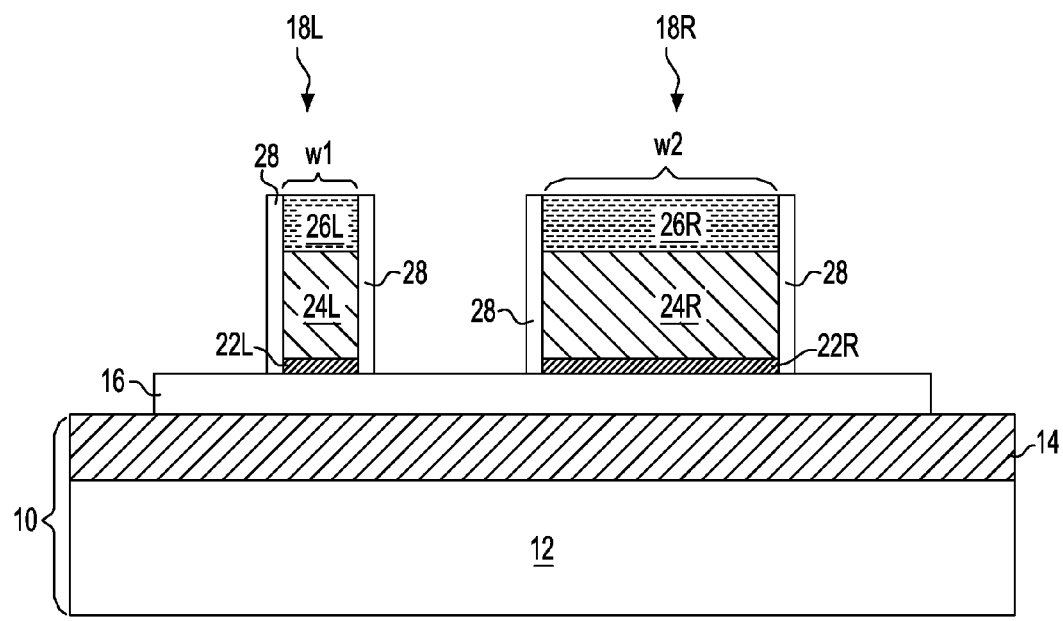
FIG. 3B is a cross sectional view of the exemplary semiconductor structure of FIG. 3A along vertical plane X-X1.

Referring now to FIGS. 3A-3B, there are illustrated the exemplary semiconductor structure of FIGS. 2A-2B after forming a dielectric spacer 28 on sidewall surfaces of the first sacrificial gate structure 18L and the second sacrificial gate structure 18R. The dielectric spacer 28 can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing each dielectric spacer 28 is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer 28 may comprise a dry etching process such as, for example, reactive ion etching.

Prior to forming the dielectric spacer 28, an ion implantation process can be used to dope exposed portions of each semiconductor material portion 16 not protected by the first and second sacrificial gate structure 18L, 18R. The ion implantation can form extension regions and/or halo regions (both not shown) within the exposed semiconductor material portion 16.

Figure 4A:
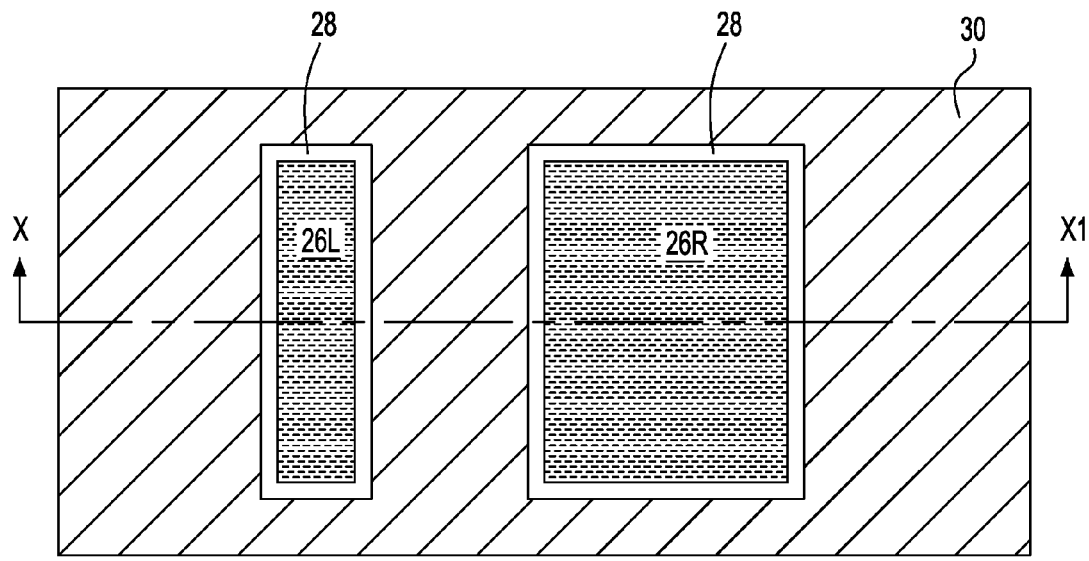
FIG. 4A is a top-down view of the exemplary semiconductor structure of FIGS. 3A-3B after forming a planarizing dielectric material.
Figure 4B:
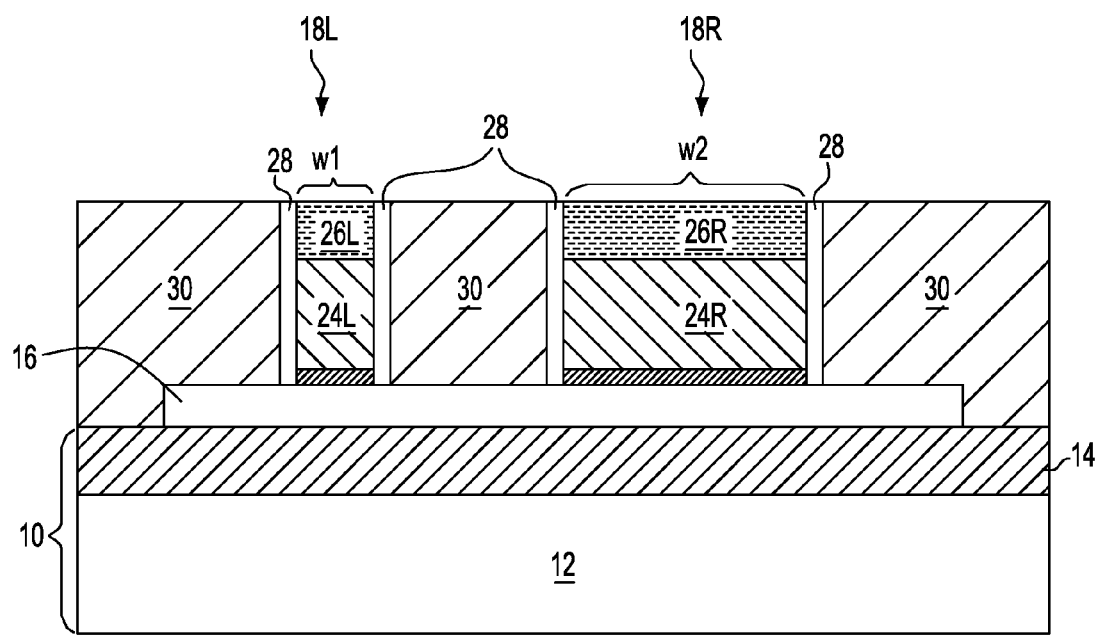
FIG. 4B is a cross sectional view of the exemplary semiconductor structure of FIG. 4A along vertical plane X-X1.

Referring now to FIGS. 4A-4B, there are illustrated the exemplary semiconductor structure of FIGS. 3A-3B after forming a planarizing dielectric material 30. The planarizing dielectric material 30 is located on outer vertical sidewalls of each dielectric spacer 28, and the planarizing dielectric material 30 surrounds the first and second sacrificial gate structures 18L, 18R. As is shown, the planarizing dielectric material 30 has a topmost surface that is coplanar with a topmost surface of the first and second sacrificial gate structures 18L, 18R. Thus, the topmost surface of each sacrificial gate structure 18L, 18R is exposed immediately after forming the planarizing dielectric material 30.

In some embodiments, the planarizing dielectric material 30 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarizing dielectric material 30. The use of a self-planarizing dielectric material as planarizing dielectric material 30 may avoid the need to perform a subsequent planarizing step.

In one embodiment, the planarizing dielectric material 30 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as planarizing dielectric material 30, a planarization process or an etch back process follows the deposition of the planarizing dielectric material 30. The thickness of the planarizing dielectric material 30 that can be employed in the present application may vary depending on the type of dielectric material employed as well as the method that was employed in forming the same. In one embodiment, the planarizing dielectric material 30 has a thickness from 80 nm to 500 nm. Other thicknesses that are greater or lesser than the range provided above can also be used for the planarizing dielectric material 30.

Figure 5A:
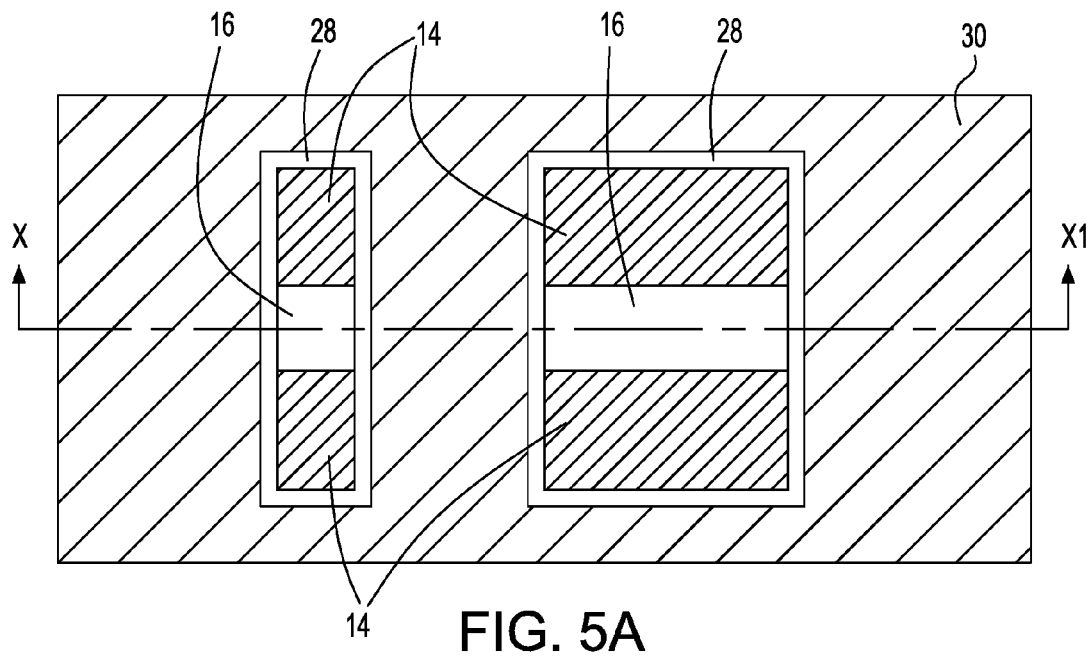
FIG. 5A is a top-down view of the exemplary semiconductor structure of FIGS. 4A-4B after providing first and second gate cavities by removing the first and second sacrificial gate structures, respectively.
Figure 5B:
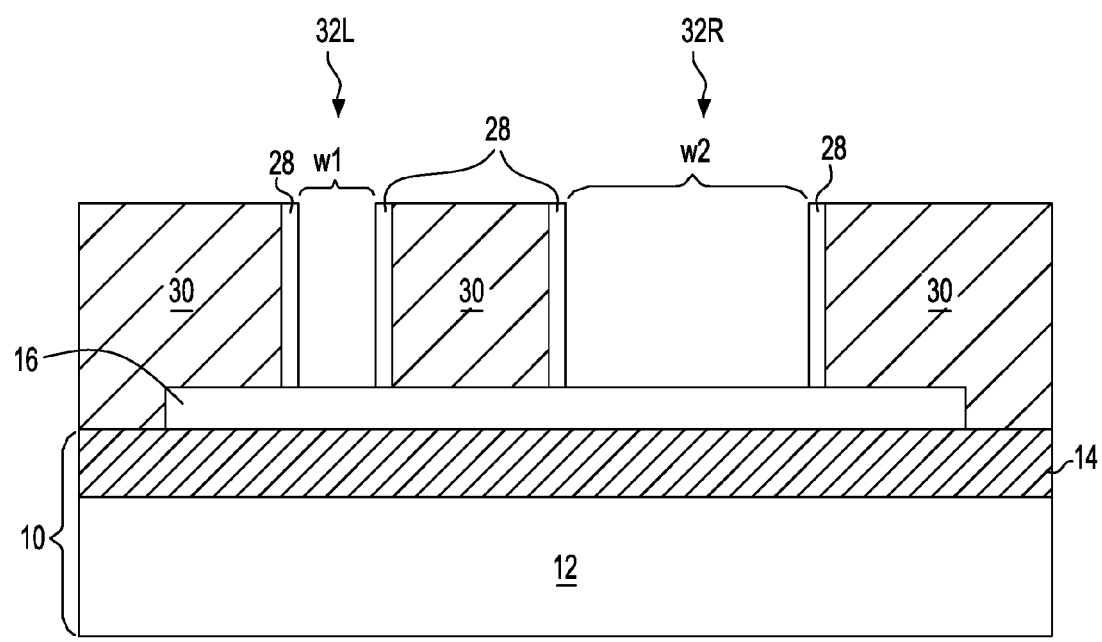
FIG. 5B is a cross sectional view of the exemplary semiconductor structure of FIG. 5A along vertical plane X-X1.

Referring now to FIGS. 5A-5B, there are illustrated the exemplary semiconductor structure of FIGS. 4A-4B after providing a first gate cavity 32L and a second gate cavity 32R by removing the first and second sacrificial gate structures 18L, 18R, respectively. The removal of the first sacrificial gate structure 18L and the second sacrificial gate structure 18R can be achieved in the present application by etching. In one example, a reactive ion etch can be used to remove each first and second sacrificial gate structures 18L, 18R.

The first gate cavity 32L includes the volume of the first sacrificial gate structure 18L, and the second gate cavity 32R includes the volume of the second sacrificial gate structure 18R. As such, the first gate cavity 32L has a width equal to w1, while the second gate cavity 32R has a width equal to w2.

The removal of the first sacrificial gate structure 18L exposes the first portion of the semiconductor material portion 16 and inner sidewall surfaces of each dielectric spacer 28 formed on the vertical sidewalls of the first sacrificial gate structure 18L, while the removal of the second sacrificial gate structure 18R exposes the second portion of the semiconductor material portion 16 and inner sidewall surfaces of dielectric spacers 32 formed on vertical sidewall surfaces of the second sacrificial gate structure 18R.

Figure 6:
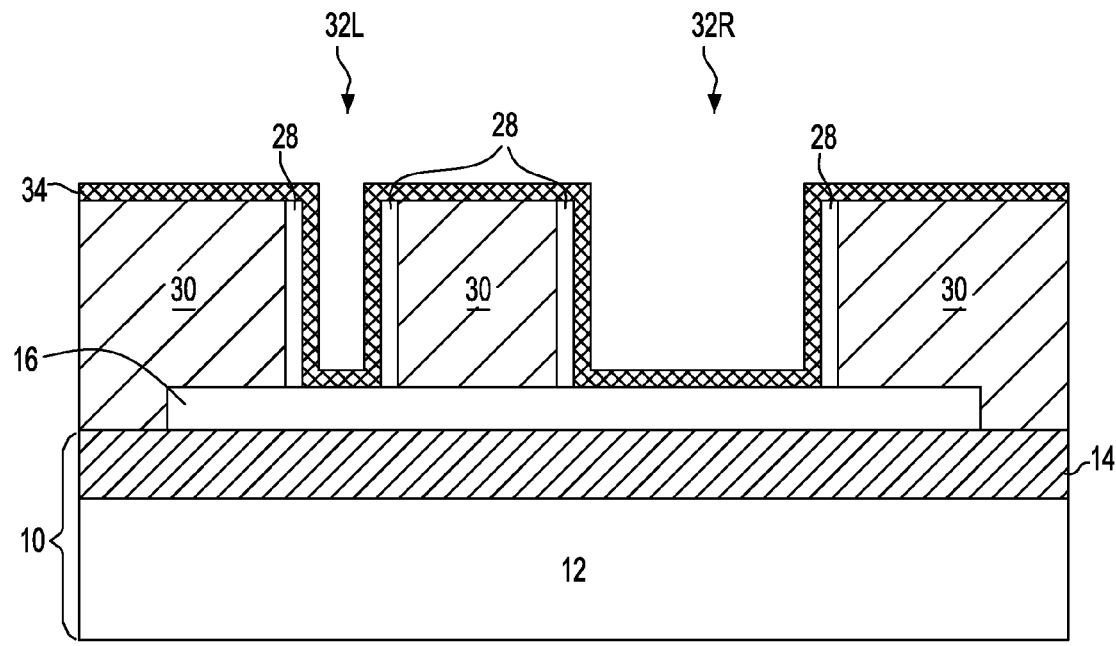
FIG. 6 is a cross sectional view of the exemplary semiconductor structure of FIGS. 5A-5B after forming a high k dielectric material layer.

Referring now to FIG. 6, there is illustrated the exemplary semiconductor structure of FIGS. 5A-5B after forming a high k dielectric material layer 34; it is noted that from this point of the present application onwards only the cross sectional through vertical plane X-X1 will be shown. As is shown, the high k dielectric material layer 34 is a contiguous layer (i.e., having no voids or breaks) that is formed on the exposed topmost surfaces of the planarizing dielectric material 30, the exposed topmost and sidewall surfaces of the dielectric spacer 28, and on the exposed surfaces of the semiconductor material portion 16 within the first and second gate cavities 32L, 32R. Thus, the high k dielectric material layer 34 is present inside and outside of the first and second cavites 32L, 32R.

The term "high k" is used throughout the present application to denote a dielectric material that has a dielectric constant that is greater than silicon dioxide. The high k dielectric material layer 34 has a dielectric constant that is greater than that of the dielectric spacer material that provides each dielectric spacer 28. Exemplary high k dielectrics that can be used as the high k dielectric material layer 34 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The high k dielectric material layer 34 can be formed by any deposition technique including, for example, chemical vapor deposition (CVD), plasma enhanced chemical vapor deposition (PECVD), physical vapor deposition (PVD), sputtering, or atomic layer deposition. The thickness of the high k dielectric material layer 34 can be from 5 to 50 nm, although other thicknesses that lesser than or greater than the aforementioned thickness range may also be employed.

Figure 7:
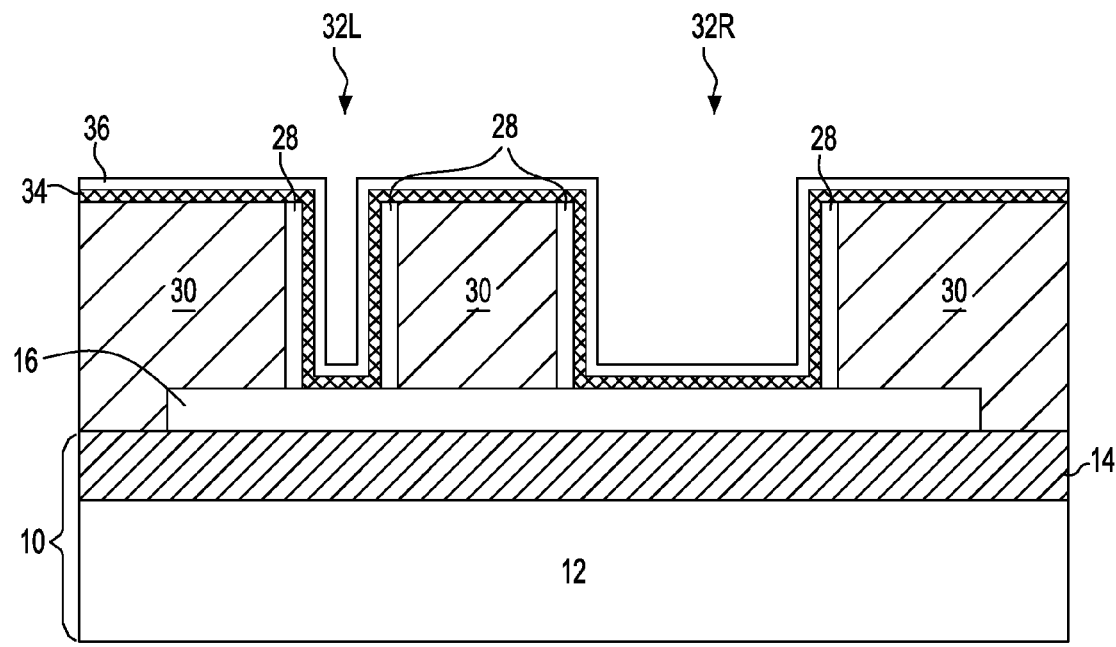
FIG. 7 is a cross sectional view of the exemplary semiconductor structure of FIG. 6 after forming a metal nitride hard mask layer over the high k dielectric material layer.

Referring now to FIG. 7, there is illustrated the exemplary semiconductor structure of FIG. 6 after forming a metal nitride hard mask layer 36 over the high k dielectric material layer 34. The metal nitride hard mask layer 36 is a contiguous layer that covers the entirety of the underlying high k dielectric material layer 34. In one embodiment of the present application, the metal nitride hard mask layer 36 is comprised of TiN. In another embodiment of the present application the metal nitride hard mask layer 36 is comprised of TaN. In a further embodiment of the present application, the metal nitride hard mask layer 36 is comprised of a multilayered stack of TaN and TiN. The metal nitride hard mask layer 36 can be formed utilizing a deposition process such as, for example, CVD, PECVD, ALD, sputtering, or physical vapor deposition (PVD). The thickness of the metal nitride hard mask layer 36 can be from 10 nm to 100 nm, although lesser and greater thicknesses can also be employed in the present application.

Figure 8:
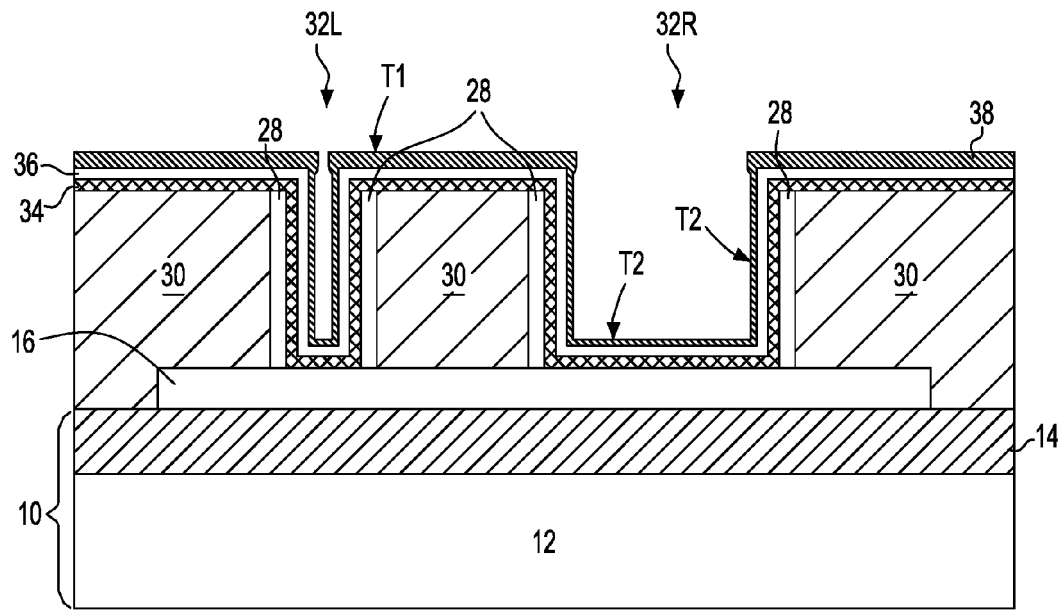
FIG. 8 is a cross sectional view of the exemplary semiconductor structure of FIG. 7 after forming an amorphous-silicon cap.

Referring now to FIG. 8, there is illustrated the exemplary semiconductor structure of FIG. 7 after forming an amorphous-silicon cap 38. The term "amorphous" as used in connection with the amorphous-silicon cap 38 denotes that the silicon material that provides the cap lacks a well ordered long range crystal structure. Thus, the amorphous-silicon cap 38 of the present application is non-crystalline.

The amorphous-silicon cap 38 that is employed in the present application has poor step coverage. By "poor step coverage" it is meant that the amorphous-silicon cap 38 has thicker portions (T1) that are located on horizontal surfaces of the exemplary semiconductor structure shown in FIG. 7 and thinner portions (T2) that are located on vertical sidewalls of the exemplary semiconductor structure shown in FIG. 7. In one embodiment, the thicker portions (T1) of the amorphous-silicon cap 38 have a thickness that is from 20 nm to 100 nm, while the thinner portions (T2) of the amorphous-silicon cap 38 have a thickness that is from 0 nm to less than 20 nm.

The amorphous-silicon cap 38 can be formed utilizing a physical vapor deposition (i.e., sputter deposition process). In one embodiment of the present application, a radio frequency (RF) can be used to create a silicon-containing plasma for depositing the amorphous-silicon cap 38 by physical vapor deposition. In some embodiments, the RF power can be adjusted during the deposition. In some embodiments of the present application, the poor step coverage can be provided due to the large distance between the source and the structure in which the amorphous-silicon cap 38 is deposited on. In some embodiments, the physical vapor deposition of the amorphous-silicon cap 38 can be performed at nominal room temperature (i.e., a temperature from 20° C. to 30° C.), and at low deposition rate. The amorphous-silicon cap 38 can be formed from various silicon sources including, for example, silanes and disilanes. Argon or other like inert gases can also be used in conjunction with the silicon source. The deposition rate can be changed by increasing gas flow of inert carrier, i.e., argon. The following parameters provide exemplary conditions that can be used in forming the amorphous-silicon cap 38 of the present application: The power can be from 100 W to 3800 W, the frequency mode can be from 100 KHz to 1 MHz, argon flow rate can be from 0 to 300 sccm, the temperature can be from 0 to 2500K, and pressure can be from 1 mTorr to 300 mTorr. Other conditions can also be used to provide the amorphous-silicon cap 38.

Figure 9:
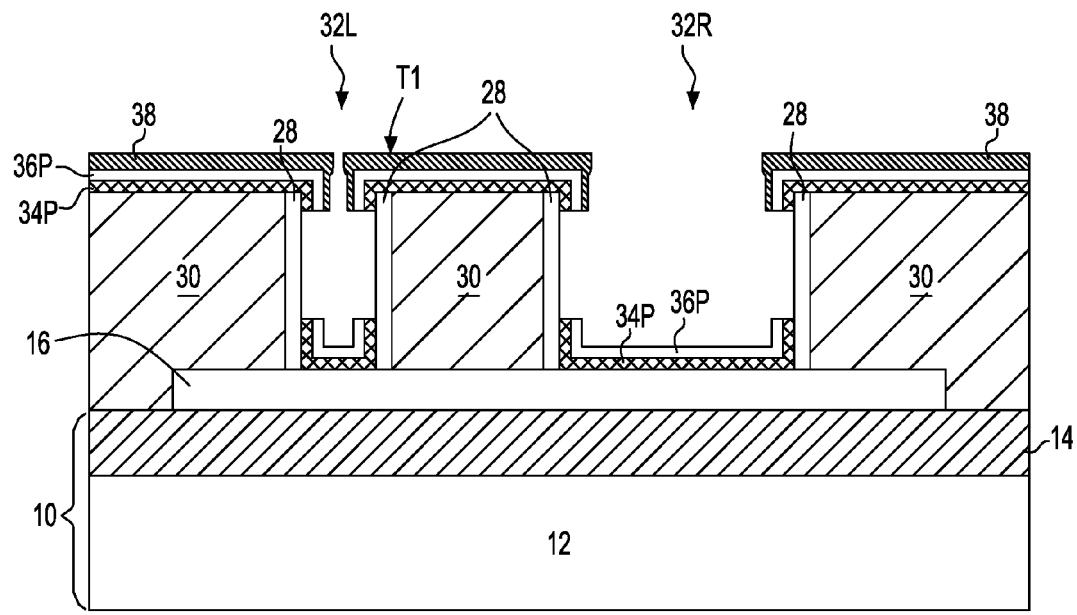
FIG. 9 is a cross sectional view of the exemplary semiconductor structure of FIG. 8 after removing vertical portions of the metal nitride hard mask layer and the high k dielectric material layer within the first and second gate cavities and exposing an inner sidewall surface of each dielectric spacer.

Referring now to FIG. 9, there is illustrated the exemplary semiconductor structure of FIG. 8 after removing vertical portions of the metal nitride hard mask layer 36 and the high k dielectric material layer 34 within the first and second gate cavities 32L, 32R and exposing inner sidewall surfaces of each dielectric spacer 28 utilizing the thicker portions T1 of amorphous-silicon cap 38 that are present outside of the first and second gate cavities 32L, 32R as a mask. It is also noted that during this step of the present application, the thinner portions T2 of the amorphous-silicon cap 38 are removed prior to removing the vertical portions of the metal nitride hard mask layer 36 and the high k dielectric material layer 34.

The thinner portions T2 of the amorphous-silicon cap 38, and the vertical portions of the metal nitride hard mask layer 36 and the high k dielectric material layer 34 within the first and second gate cavities 32L, 32R can be removed by performing various etch processes which are selective for removing each of the various layers from the exemplary semiconductor structure. The thinner portions T2 of the amorphous-silicon cap 38 can be removed by utilizing a hot ammonium etchant; some thinning of the thicker portions T1 of the amorphous-silicon cap 38 may occur. The vertical portions of the metal nitride hard mask layer 36 can be removed using an ammonium based etchant. The ammonium based etchant used for removing the vertical portions of the metal nitride hard mask layer 36 may be the same or different from that used in removing the thinner portions T2 of the amorphous silicon cap 38. In one example, an alkaline solution (SC-1) including an aqueous mixture of ammonium hydroxide and hydrogen peroxide (e.g., 1:1:5 of 30% $H_2O_2$, 28% $NH_4OH$ and $H_2O$) can be used to remove the vertical portions of the metal nitride hard mask layer 36. The vertical portions of the high k dielectric material layer 34 can be removed utilizing an HF etchant.

After performing the above etching processes, portions of the metal nitride hard mask layer remain in the exemplary structure, while portions of the high k dielectric material layer remain in the exemplary structure. The remaining portions of the metal nitride hard mask layer can be referred to herein as a metal nitride hard mask portion 36P, while the remaining portions of the high k dielectric material layer can be referred to herein as a high k dielectric material portion 34P. As is shown, an upper portion and a lower portion of the first and second gate cavities 32L, 32R include a material stack comprising, from bottom to top, high k dielectric material portion 34P and metal nitride hard mask portion 36P.

Figure 10:
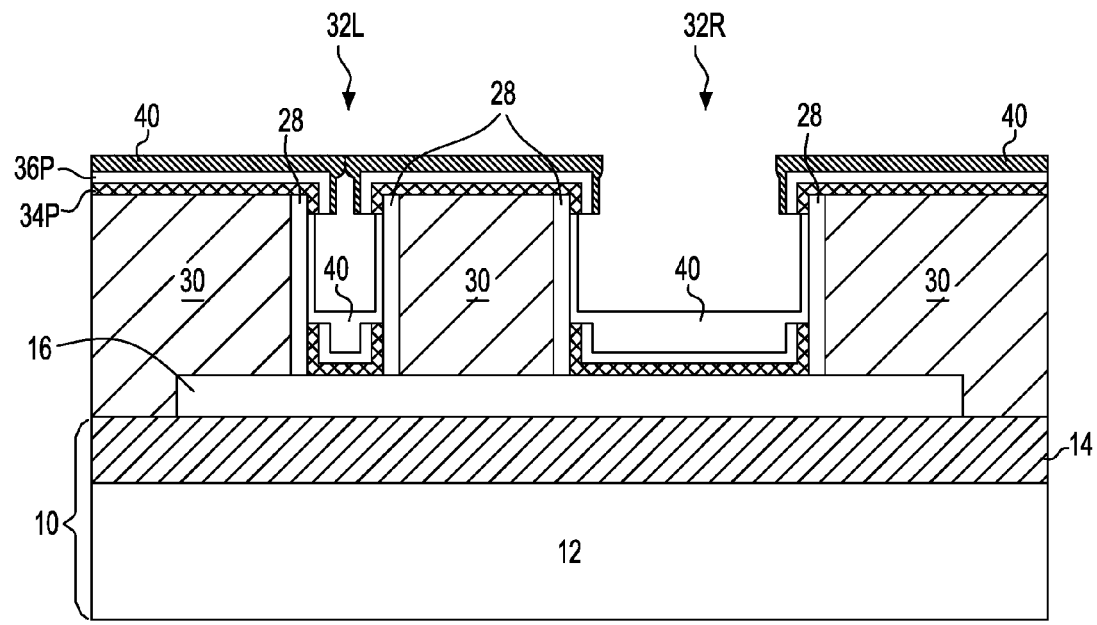
FIG. 10 is a cross sectional view of the exemplary semiconductor structure of FIG. 9 after forming an additional amorphous-silicon cap to seal off the first gate cavity.

Referring now to FIG. 10, there is illustrated the exemplary semiconductor structure of FIG. 9 after forming an additional amorphous-silicon material to provide another amorphous-silicon cap 40. The another amorphous-silicon cap 40 includes remaining portions of amorphous-silicon cap 38 and additionally deposited amorphous silicon material. The another amorphous-silicon cap 40 seals off the first gate cavity 32L, but not the second gate cavity 32R. The another amorphous-silicon cap 40 has the same properties as amorphous-silicon cap 38. Also, the another amorphous-silicon cap 40 can be formed utilizing the technique mentioned above in forming the amorphous-silicon cap 38. As shown, a portion of the another amorphous-silicon cap 40 forms on the exposed inner sidewall surfaces of the dielectric spacer 28 within each first and second gate cavities 32L, 32R.

Figure 11:
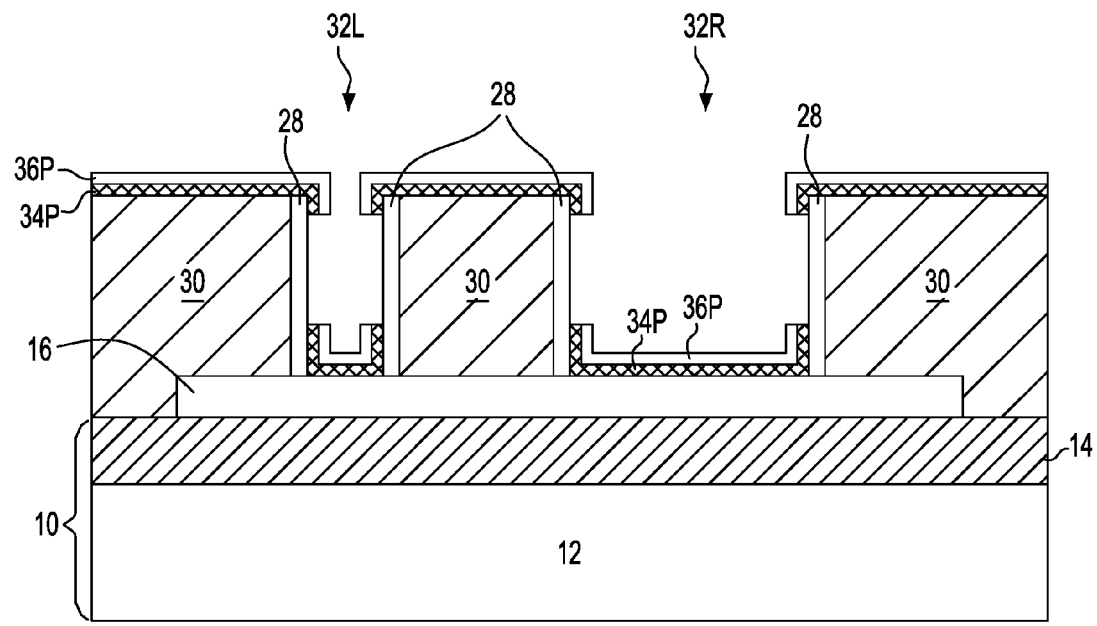
FIG. 11 is a cross sectional view of the exemplary semiconductor structure of FIG. 10 after removing the additional amorphous-silicon cap and amorphous silicon cap.

Referring now to FIG. 11, there is illustrated the exemplary semiconductor structure of FIG. 10 after removing the another amorphous silicon cap 40 from the structure. The another amorphous silicon cap 40 can be removed utilizing an etching process that is selective in removing amorphous silicon. In one embodiment of the present application, the another amorphous silicon cap 40 can be removed utilizing a hot ammonium etchant.

Figure 12:
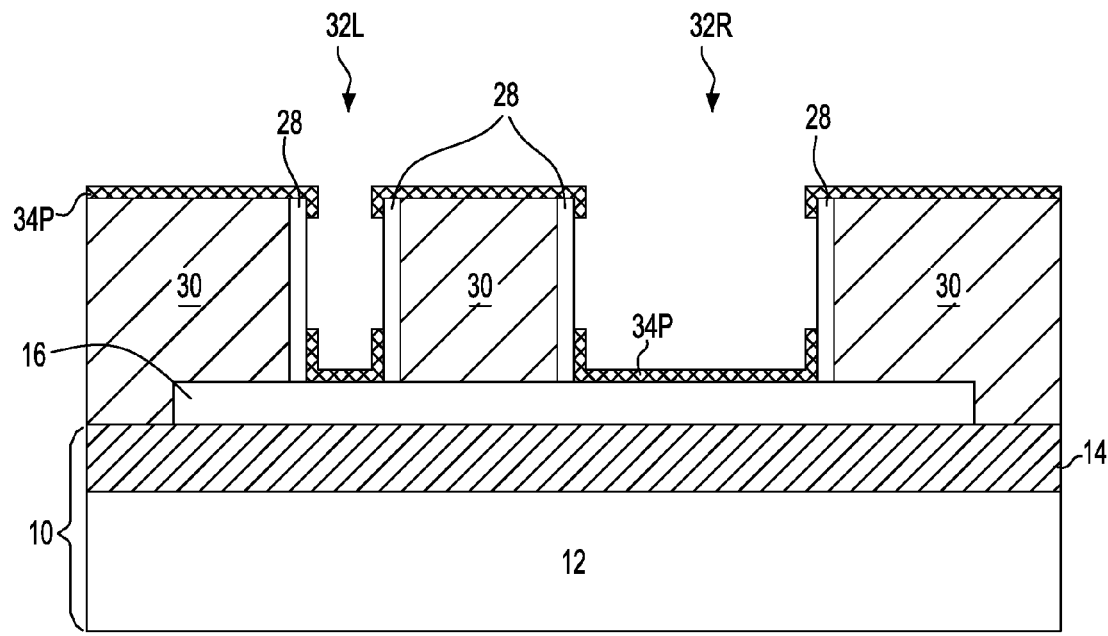
FIG. 12 is a cross sectional view of the exemplary semiconductor structure of FIG. 11 after removing remaining portions of the metal nitride hard mask layer.

Referring now to FIG. 12, there is illustrated the exemplary semiconductor structure of FIG. 11 after removing remaining portions of the metal nitride hard mask layer, i.e., metal nitride hard mask portions 36P, from the structure. The remaining portions of the metal nitride hard mask layer, i.e., metal nitride hard mask portions 36P, can be removed from the structure utilizing an ammonium based etchant. In one example, an alkaline solution (SC-1) including an aqueous mixture of ammonium hydroxide and hydrogen peroxide (e.g., 1:1:5 of 30% $H_2O_2$, 28% $NH_4OH$ and $H_2O$) can be used to remove the metal nitride hard mask layer, i.e., metal nitride hard mask portions 36P, from the structure. At this point of the present application, the high k dielectric portion 34P located at the upper portion and the lower portion of the first and second gate cavities 32L, 32R is exposed.

Figure 13:
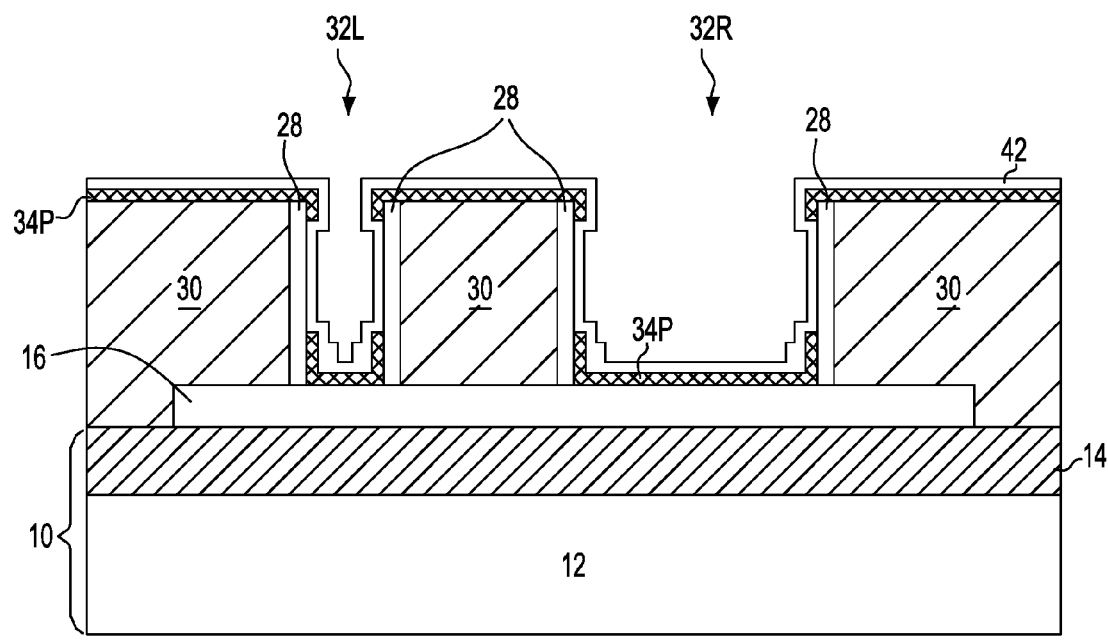
FIG. 13 is a cross sectional view of the exemplary semiconductor structure of FIG. 12 after forming a workfunction metal layer.

Referring now to FIG. 13, there is illustrated the exemplary semiconductor structure of FIG. 12 after forming a workfunction metal layer 42. As is shown, the workfunction metal layer 42 is formed inside and outside the first gate cavity 32L and the second gate cavity 32R. As is also shown, portions of a bottommost surface of the workfunction metal layer 42 directly contact topmost surfaces of the high k dielectric material portions 34P, while other portions of the bottommost surface of the workfunction metal layer 42 directly contact the inner sidewall surfaces of the dielectric spacers 28.

In one embodiment, the workfunction metal layer 42 is an n-type work function metal. As used herein, an "n-type work function metal" is a metal that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal ranges from 4.1 eV to 4.3 eV. In one embodiment, the n-type work function metal that can be used as the workfunction metal layer 42 is composed of at least one of TiAl, TaN, TiN, HfN, HfSi, or combinations thereof. The n-type work function metal can be formed using chemical vapor deposition (CVD), atomic layer deposition (ALD), sputtering or plating.

In another embodiment, the work function metal that provides the workfunction metal layer 42 may be a p-type work function metal. As used herein, a "p-type work function metal" is a metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal that provides the workfunction metal layer 42 may be composed of titanium, titanium nitride or titanium carbide. In one embodiment, the p-type work function metal that provides the workfunction metal layer 42 is composed of titanium nitride (TiN). The p-type work function metal may also be composed of TiAlN, Ru, Pt, Mo, Co and alloys and combinations thereof. In one embodiment, the p-type work function metal layer can be formed by, a physical vapor deposition (PVD) method, such as sputtering, chemical vapor deposition (CVD) or atomic layer deposition (ALD).

In some embodiments (not shown), the workfunction metal layer 42 formed into the first gate cavity 32L comprises a different workfunction metal than the workfunction metal layer 42 that is formed into the second gate cavity 32R. In such an embodiment, block mask technology can be used in forming the different workfunction metals within the first and second gate cavities 32L, 32R.

Figure 14:
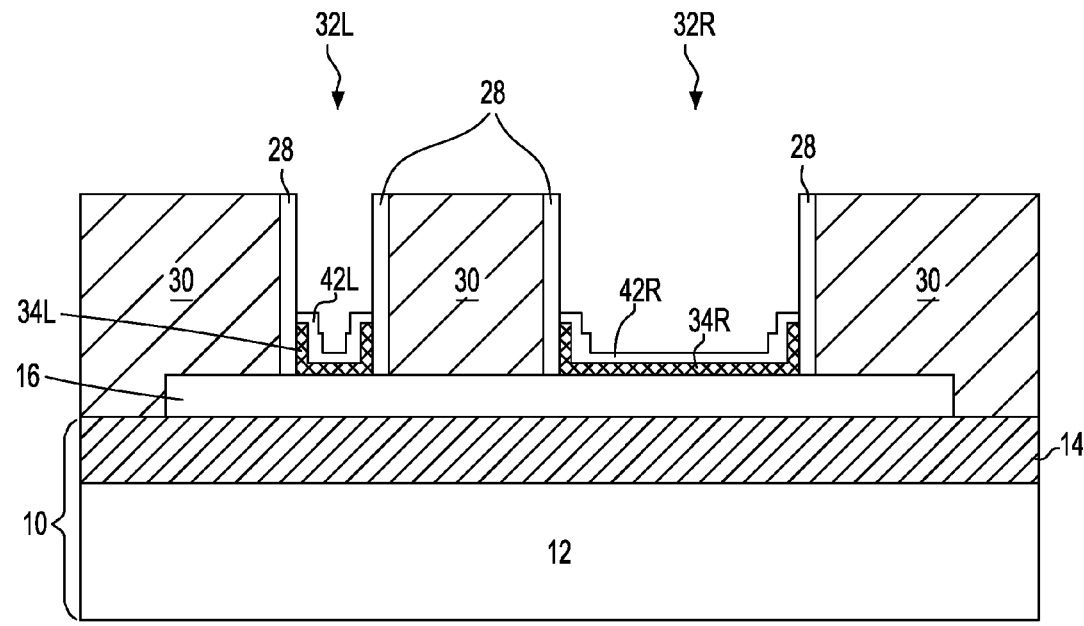
FIG. 14 is a cross sectional view of the exemplary semiconductor structure of FIG. 13 after patterning the workfunction metal layer.

Referring now to FIG. 14, there is illustrated the exemplary semiconductor structure of FIG. 13 after patterning the workfunction metal layer 42. After patterning, a remaining portion of the workfunction metal layer 42 is present in the bottom portion of each of the first and second gate cavities 32L, 32R. The remaining portion of the workfunction metal layer 42 within the first gate cavity 32L is referred to herein as a first workfunction metal portion 42L, while the remaining portion of the workfunction metal layer in the second gate cavity 32R is referred to herein as a second workfunction metal portion 42R. As is shown, the first and second workfunction metal portions 42L, 42R have a stair-like surface profiles. By "stair-like surface profile" it is meant that a surface (either upper or lower) of a material has a series of horizontal surfaces, i.e. mesa, and vertical surfaces that lead from one level to another level.

In some embodiments of the present application, the patterning can be achieved by using an organic planarization layer (OPL) chamfering process. The organic planarization layer (OPL) chamfering process includes forming an organic planarization dielectric OPL material. The OPL material may include one of the planarizing dielectric materials mentioned above. The OPL material within each gate cavities is then recessed utilizing an etch that is selective for removing the OPL material. Another etch is then used to pattern the workfunction metal layer 42 in the each of the gate cavities containing the recessed OPL material. During the etch that patterns the workfunction metal layer, the high k dielectric material portions 34P are removed from the upper portion of each of the gate cavities; the high k dielectric material portions that are present within the lower portion of the first and second gate cavities remain and serve as a gate dielectric of a functional gate structure to be subsequently formed. The remaining high k dielectric material within the lower portion of the first gate cavity 32L is herein after referred to as a first low k dielectric material portion 34L, while the high k dielectric material within the lower portion of the second gate cavity 32R is herein after referred to as a second low k dielectric material portion 34R. As is shown, the first low k dielectric material portion 34L is entirely covered by the first workfunction metal portion 42L, while the second low k dielectric material portion 42L is entirely covered by the second workfunction metal portion 42R. As is also shown, the topmost level of the stair-like surface profile of the first and second workfunction metal portions 42L, 42R has a sidewall surface that directly contacts a portions of the inner sidewall surface of the dielectric spacer 28.

Figure 15:
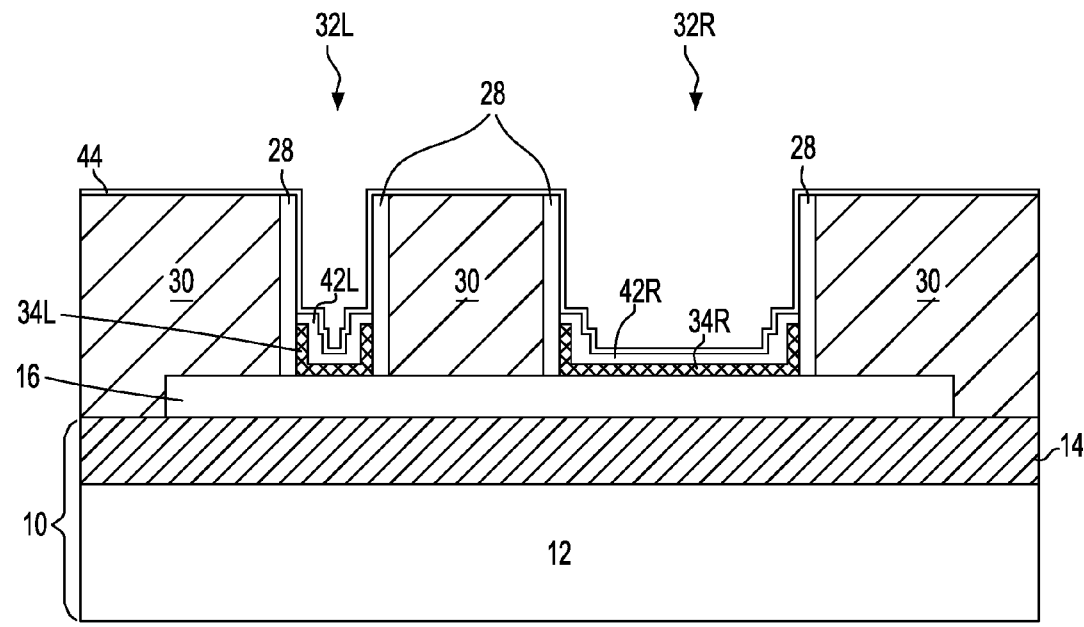
FIG. 15 is a cross sectional view of the exemplary semiconductor structure of FIG. 14 after formation of a diffusion barrier liner.

Referring now to FIG. 15, there is illustrated the exemplary semiconductor structure of FIG. 14 after formation of a diffusion barrier liner 44. Portions of the diffusion barrier liner 44 that contact the first and second workfunction metal portions 42L, 42R also have a stair-like surface profile. The diffusion barrier liner 44 includes a diffusion barrier material such as, for example, Ta, TaN, Ti, TiN, Ru, RuN, RuTa, RuTaN, IrTa, IrTaN, W, WN or any other material that can serve as a barrier to prevent a conductive material from diffusing there through. In one embodiment of the present application, the diffusion barrier material that forms the diffusion barrier liner 44 has a thickness from 4 nm to 38 nm. Other thicknesses that are lesser than or greater than the aforementioned thickness range can also be employed for the diffusion barrier material. The diffusion barrier material that forms the diffusion barrier liner 44 may be formed by a deposition process. Examples of deposition processes that can be used in forming the diffusion barrier material include, but are not limited to, CVD, PECVD, PVD, sputtering or plating. As is shown, the diffusion barrier liner 44 is a contiguous material that is formed on the exposed surfaces of the planarizing dielectric material 30, the exposed surfaces of the dielectric spacer 28 and exposed surfaces of the first and second workfunction metal portions 42L, 42R.

Figure 16:
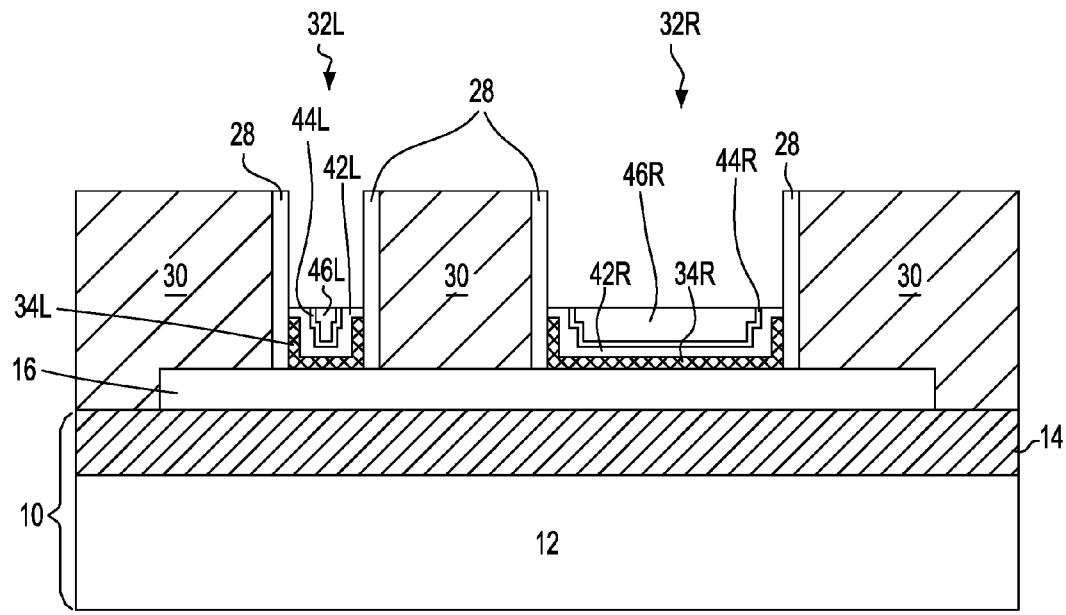
FIG. 16 is a cross sectional view of the exemplary semiconductor structure of FIG. 15 after forming a conductive metal and recessing.

Referring now to FIG. 16, there is illustrated the exemplary semiconductor structure of FIG. 15 after forming a conductive metal and recessing. The deposited and recessed conductive metal within the first gate cavity 32L is referred to herein as a first metal structure 46L, while the deposited and recessed conductive metal within the second gate cavity 32R is referred to herein as a second metal structure 46R. During the recessing process, portions of the diffusion barrier liner 44 are removes from the structure. The remaining diffusion barrier liner within the first gate cavity is referred to herein as a first diffusion barrier portion 44L, while the remaining diffusion barrier liner within the second gate cavity 32R is referred herein as a second diffusion barrier portion 44R. As is shown, the diffusion barrier portion 44L, 44R separates the respective metal structure 46L, 46R from an underlying workfunction metal portion 42L, 42R. As is also shown, a topmost surface of the metal structure 46L, 46R is coplanar with a topmost surface of diffusion barrier portion 44L, 44R and the workfunction metal portion 42L, 42R.

The conductive metal used in providing the first and second metal structures 46L, 46R may include an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The conductive metal can be formed by utilizing a deposition process such as, for example, CVD, PECVP, plating, or sputtering. When a metal silicide is used as the conductive metal, the metal silicide can be formed by a conventional silicidation process. After formation of the conductive metal, the conductive metal is recessed utilizing an etch such as, for example, reactive ion etching, that selectively removes a portion of the conductive metal providing the metal structures 46L, 46R.

Figure 17:
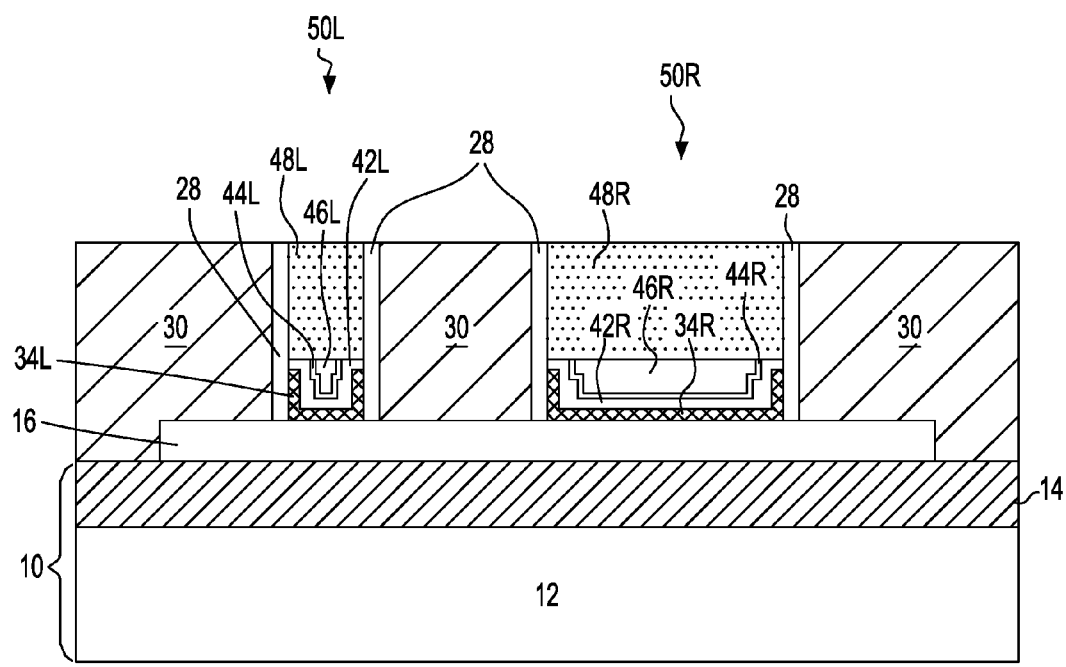
FIG. 17 is a cross sectional view of the exemplary semiconductor structure of FIG. 16 after forming a dielectric cap above the recessed conductive metal.

Referring now to FIG. 17, there is illustrated the exemplary semiconductor structure of FIG. 16 after forming a dielectric cap above the recessed conductive metal, i.e., the conductive metal structure 46L, 46R. The dielectric cap includes a dielectric material such as for example, silicon dioxide, silicon nitride and/or silicon oxynitride. The dielectric cap can be formed by a deposition process including, for example, chemical vapor deposition, and plasma enhanced chemical vapor deposition. The dielectric cap can have a thickness from 1 to 20 nm. Other thicknesses can also be used for the thickness of the dielectric cap. The dielectric cap located within the first gate cavity 32L is referred to herein as a first dielectric cap 48L, while the dielectric cap located in the second gate cavity 32R is referred to herein as a second dielectric cap 48R. Each dielectric cap 48L, 48R has a topmost surface that is coplanar with a topmost surface of the planarizing dielectric material 30. Also, a bottommost surface of the dielectric cap 48L, 48R contacts a topmost surface of metal structure 46L, 46R, diffusion barrier portion 44L, 44R and workfunction metal portion 42L, 42R.

Each gate cavity is thus filled with a replacement metal gate (or functional gate) structure. The term "functional gate structure" is used throughout the present application as a permanent gate structure used to control output current (i.e., flow of carriers in the channel) of a semiconducting device through electrical or magnetic fields. The replacement metal gate structure within the first gate cavity is referred to here as a first functional gate structure 50L which includes from bottom to top, first high k gate dielectric portion 34L, first workfunction metal portion 42L, first metal structure 46L, and first dielectric cap 48L. The first functional gate structure 50L has a channel length that is equal to w1.

The replacement metal gate structure within the second gate cavity is referred to here as a second functional gate structure 50R which includes from bottom to top, second high k gate dielectric portion 34R, second workfunction metal portion 42R, second metal structure 46R, and second dielectric cap 48R. The second functional gate structure 50R has a channel length that is equal to w2. In accordance with the present application, the first and the second metal structures 46L, 46R have a stair-like surface profile. Also, and as shown in the drawing, a topmost surface of the first workfunction metal portion 42L, the first diffusion barrier portion 44P, and the first metal structure 46L are coplanar with each other, but not coplanar with a topmost surface of the first high k gate material portion 34L. Further, a topmost surface of the second workfunction metal portion 42R, the second diffusion barrier portion 44R, and the second metal structure 46R are coplanar with each other, but not coplanar with a topmost surface of the second high k gate material portion 34R.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:
1. A semiconductor structure comprising:
a first functional gate structure of a first width and located on a surface of a semiconductor material portion, said first functional gate structure comprising, from bottom to top, a first high k gate dielectric material portion, a first workfunction metal portion having a stair-like surface profile, a first diffusion barrier portion, a first metal structure and a first dielectric cap;

a second functional gate structure of a second width that is greater than said first width and located on another surface of said semiconductor material portion, said second functional gate structure comprising, from bottom to top, a second high k gate dielectric material portion, a second workfunction metal portion having a stair-like surface profile, a second diffusion barrier portion, a second metal structure and a second dielectric cap;

a dielectric spacer located on each sidewall surface of said first and said second functional gate structures; and a planarizing dielectric material located adjacent said dielectric spacer, wherein a topmost surface of said planarizing dielectric material is coplanar with a topmost surface of said first and said second dielectric caps.

2. The semiconductor structure of claim 1, wherein said semiconductor material portion comprises a semiconductor fin.

3. The semiconductor structure of claim 2, wherein said first and said second functional gate structures straddle said semiconductor material portion.

4. The semiconductor structure of claim 1, wherein said first and said second workfunction metal portions are n-type workfunction metals.

5. The semiconductor structure of claim 1, wherein said first and said second workfunction metal portions are p-type workfunction metals.

6. The semiconductor structure of claim 1, wherein said first and said second diffusion barrier portions are selected from Ta, TaN, Ti, TiN, Ru, RuN, RuTa, RuTaN, IrTa, IrTaN, W and WN.

7. The semiconductor structure of claim 1, wherein said first and said second metal structures comprise an elemental metal, an alloy of at least two element metals, an elemental metal nitride, and elemental metal silicide and multilayered stacks thereof.

8. The semiconductor structure of claim 1, wherein said first and said second metal structures have a stair-like surface profile.

9. The semiconductor structure of claim 1, wherein a topmost surface of said first workfunction metal portion, said first diffusion barrier portion, and said first metal structure are coplanar with each other, but not coplanar with a topmost surface of said first high k gate material portion, and wherein a topmost surface of said second workfunction metal portion, said second diffusion barrier portion, and said second metal structure are coplanar with each other, but not coplanar with a topmost surface of said second high k gate material portion.

* * * * *